United States Patent
Yang et al.

(10) Patent No.: US 10,573,532 B2
(45) Date of Patent: Feb. 25, 2020

(54) METHOD FOR PROCESSING A WORKPIECE USING A MULTI-CYCLE THERMAL TREATMENT PROCESS

(71) Applicants: Mattson Technology, Inc., Fremont, CA (US); Beijing E-Town Semiconductor Technology, Co., LTD, Beijing (CN)

(72) Inventors: Michael X. Yang, Palo Alto, CA (US); Shawming Ma, Sunnyvale, CA (US)

(73) Assignees: MATTSON TECHNOLOGY, INC., Fremont, CA (US); BEIJING E-TOWN SEMICONDUCTOR TECHNOLOGY, CO., LTD, Beijing (CN)

( * ) Notice: Subject to any disclaimer, the term of this patent is extended or adjusted under 35 U.S.C. 154(b) by 0 days.

(21) Appl. No.: 16/020,178

(22) Filed: Jun. 27, 2018

(65) Prior Publication Data
US 2019/0385862 A1    Dec. 19, 2019

Related U.S. Application Data

(60) Provisional application No. 62/685,564, filed on Jun. 15, 2018.

(51) Int. Cl.
*H01L 21/324* (2006.01)
*H01L 21/67* (2006.01)
(Continued)

(52) U.S. Cl.
CPC .......... *H01L 21/324* (2013.01); *C23C 16/463* (2013.01); *H01L 21/67098* (2013.01); *H01L 21/68735* (2013.01)

(58) Field of Classification Search
None
See application file for complete search history.

(56) References Cited

U.S. PATENT DOCUMENTS 6,303,520 B1 * 10/2001 Kwong ............... H01L 21/3145
257/E21.269
6,638,876 B2 * 10/2003 Levy .................. C23C 16/0218
438/769

(Continued)

FOREIGN PATENT DOCUMENTS

JP    2008-027932    2/2008

OTHER PUBLICATIONS

PCT International Search Report and Written Opinion for corresponding PCT Application No. PCT/US2019/032811, dated Sep. 6, 2019, 12 pages.

*Primary Examiner* — Thor S Campbell
(74) *Attorney, Agent, or Firm* — Dority & Manning, P.A.

(57) ABSTRACT

A method for processing a workpiece is provided. The method can include placing a workpiece on a susceptor disposed within a processing chamber. The method can include performing a multi-cycle thermal treatment process on the workpiece in the processing chamber. The multi-cycle thermal treatment process can include at least two thermal cycles. Each thermal cycle of the at least two thermal cycles can include performing a first treatment on the workpiece at a first temperature; heating a device side surface of the workpiece to a second temperature in less than one second; performing a second treatment on the workpiece at approximately the second temperature; and cooling the workpiece subsequent to performing the second treatment.

14 Claims, 6 Drawing Sheets

(51) Int. Cl.
*H01L 21/687* (2006.01)
*C23C 16/46* (2006.01)

(56) References Cited

U.S. PATENT DOCUMENTS

| | | | | |
|---|---|---|---|---|
| 7,015,422 B2 * | 3/2006 | Timans | ............... | C23C 16/481 |
| | | | | 118/724 |
| 7,543,981 B2 * | 6/2009 | Timans | ............... | G01K 11/125 |
| | | | | 250/338.1 |
| 7,704,898 B2 * | 4/2010 | Nenyei | ............... | F27B 5/04 |
| | | | | 118/724 |
| 7,734,439 B2 * | 6/2010 | Timans | ............... | G01J 5/0003 |
| | | | | 702/99 |
| 8,335,658 B2 * | 12/2012 | Merkl | ............... | G01J 5/0003 |
| | | | | 702/136 |
| 2002/0102098 A1 | 8/2002 | Camm | ............... | C30B 31/12 |
| | | | | 392/416 |
| 2003/0183612 A1 * | 10/2003 | Timans | ............... | C30B 31/12 |
| | | | | 219/390 |
| 2004/0105670 A1 | 6/2004 | Kusuda et al. | | |
| 2005/0051102 A1 * | 3/2005 | Sato | ............... | C23C 16/4401 |
| | | | | 118/729 |
| 2005/0063448 A1 * | 3/2005 | Kusuda | ............ | H01L 21/67115 |
| | | | | 374/1 |
| 2005/0112854 A1 | 5/2005 | Ito et al. | | |
| 2006/0180082 A1 | 8/2006 | Iwamoto et al. | | |
| 2006/0225657 A1 | 10/2006 | Mizushima et al. | | |
| 2006/0291835 A1 | 12/2006 | Nozaki et al. | | |
| 2007/0117362 A1 | 5/2007 | Dairiki et al. | | |
| 2009/0103906 A1 * | 4/2009 | Kusuda | ............... | F27B 17/0025 |
| | | | | 392/418 |
| 2009/0120924 A1 * | 5/2009 | Moffatt | ............... | B23K 26/0626 |
| | | | | 219/385 |
| 2009/0139657 A1 * | 6/2009 | Lee | ............... | H01J 37/32357 |
| | | | | 156/345.24 |
| 2010/0273277 A1 * | 10/2010 | Qin | ............... | H01J 37/32522 |
| | | | | 438/5 |
| 2010/0279020 A1 * | 11/2010 | Melnik | ............... | C23C 16/303 |
| | | | | 427/419.7 |
| 2012/0288970 A1 * | 11/2012 | Hashimoto | ....... | H01L 21/67115 |
| | | | | 438/16 |
| 2015/0021772 A1 * | 1/2015 | Adhiprakasha | ..... | H01L 21/2855 |
| | | | | 257/751 |
| 2015/0380302 A1 * | 12/2015 | Mountsier | ......... | H01L 21/76831 |
| | | | | 438/654 |
| 2016/0097123 A1 * | 4/2016 | Shugrue | ............... | C23C 16/46 |
| | | | | 427/255.28 |
| 2016/0195333 A1 * | 7/2016 | Kawarazaki | ........ | F27B 17/0025 |
| | | | | 438/761 |
| 2018/0166296 A1 | 6/2018 | Ma | | |
| 2018/0218915 A1 * | 8/2018 | Kim | .................. | H01L 21/02236 |

\* cited by examiner

METHOD FOR PROCESSING A WORKPIECE USING A MULTI-CYCLE THERMAL TREATMENT PROCESS

PRIORITY CLAIM

The present application is related and claims the benefit of priority to U.S. Provisional Patent Application No. 62/685,564, filed on Jun. 15, 2018, entitled "Method for Processing a Workpiece Using a Multi-Cycle Thermal Treatment Process," the entirety of which is incorporated by reference for all purposes.

FIELD

The present disclosure relates generally to a method for processing a workpiece using a multi-cycle thermal treatment process.

BACKGROUND

In semiconductor processing, advanced film deposition or removal processes can be implemented to process a workpiece, such as a semiconductor wafer. The film deposition or removal processes can include repetitive thermal cycles. For instance, atomic layer deposition or etch processes can include multiple cycles of alternating surface treatment and surface activation processes in which material is deposited or removed from the workpiece during each cycle. In some instances, the surface activation and surface treatment processes can be performed at different temperatures. For instance, the surface activation process can include an annealing or a surface chemical reaction occurring at a temperature that is elevated compared to a temperature at which the surface treatment step is performed. When multiple surface activation and/or surface treatment processes are needed to process the workpiece, an amount of time required to implement the processes can limit the throughput (e.g., number of workpieces manufactured) of the semiconductor manufacturing process.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The method can include placing a workpiece on a susceptor disposed within a processing chamber. The method can include performing a multi-cycle thermal treatment process on the workpiece in the processing chamber. The multi-cycle thermal treatment process can include at least two thermal cycles. Each thermal cycle of the at least two thermal cycles can include performing a first treatment on the workpiece at a first temperature; heating a device side surface of the workpiece to a second temperature; performing a second treatment on the workpiece at approximately the second temperature; and cooling the workpiece subsequent to performing the second treatment. The thermal cycles can be performed in the same processing chamber without having to remove the workpiece from the processing chamber.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
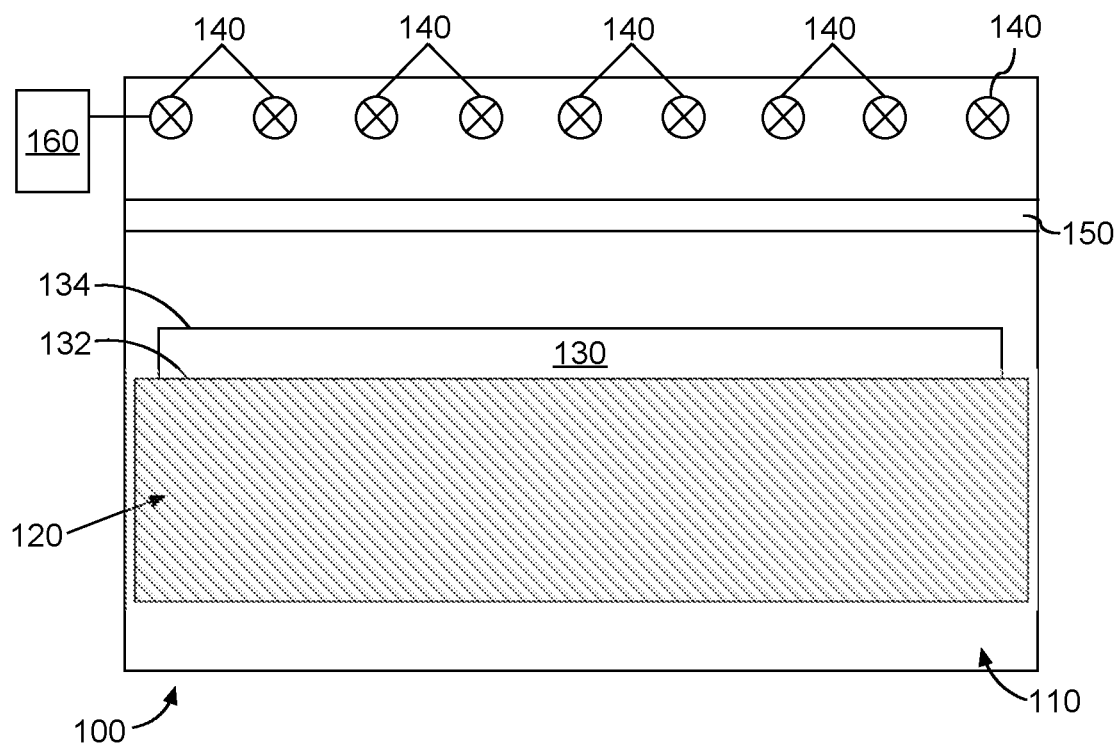
FIG. 1 depicts a cross-sectional view of an example workpiece processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to a method for processing a workpiece using a multi-cycle thermal treatment process. The method can include placing the workpiece on a susceptor disposed within a processing chamber. The method can include implementing the multi-cycle thermal treatment process on the workpiece while the workpiece is disposed within the processing chamber. The multi-cycle thermal treatment process can include multiple thermal cycles. Each thermal cycle can be performed in the same processing chamber without having to remove the workpiece from the processing chamber. Subsequent to performing the multi-cycle thermal treatment process, the method can include removing the workpiece from the processing chamber.

In some embodiments, each cycle of the multi-cycle thermal treatment process can include performing a first treatment on the workpiece at a first temperature. For instance, performing the first treatment includes exposing the workpiece to one or more species generated in a remote plasma chamber. Alternatively and/or additionally, performing the first treatment can include exposing the workpiece to one or more gases.

In some embodiments, each cycle of the multi-cycle thermal treatment process can include heating a device side surface of the workpiece to a second temperature. More specifically, one or more flash lamps disposed within the processing chamber can be configured to heat the device side surface of the workpiece. In some embodiments, the one or more flash lamps can be configured to heat the device side surface of the workpiece to the second temperature in less than about one second. For instance, the one or more flash lamps can be configured to heat the device side surface of the workpiece to the second temperature in about 0.5 milliseconds to about 10 milliseconds. In some embodiments, the one or more lamps can be configured to heat the device side surface of the workpiece to the second temperature in less than about 1.0 millisecond.

In some embodiments, each cycle of the multi-cycle thermal treatment process can include performing a second treatment on the workpiece at approximately the second temperature. The second treatment process can, in some embodiments, include exposing the device side surface of the workpiece to one or more gases. Alternatively and/or additionally, the second treatment process can include exposing the device side surface of the workpiece to one or more species generated in a remote plasma chamber. In some embodiments, the second treatment can include implementing a chemical reaction on the device side surface of the workpiece.

In some embodiments, each cycle of the multi-cycle thermal treatment process can include cooling the workpiece subsequent to performing the second treatment. For instance, the workpiece bulk and/or a susceptor disposed within the processing chamber and supporting the workpiece can be configured to cool the workpiece after the second treatment performed at the second temperature. In some embodiments, the susceptor can be configured to accommodate a flow of fluid to cool the workpiece. It should be appreciated that the flow of fluid can be comprised of any suitable fluid (e.g., liquid or gas). For example, the flow of fluid can be comprised of Freon. As another example, the fluid can be comprised of water. As yet another example, the fluid can be comprised of ethylene glycol. As still another example, the fluid can be comprised of ethylene glycol and water.

In some embodiments, the multi-cycle thermal treatment process can be associated with an atomic layer deposition process. Alternatively and/or additionally, the multi-cycle thermal treatment process can be associated with an atomic layer etch process. In some embodiments, a layer of material can be removed from the workpiece during each cycle of the multi-cycle thermal treatment process. Alternatively and/or additionally, a layer of material can be deposited onto the workpiece during each cycle of the multi-cycle thermal treatment process.

In some embodiments, a method for processing a workpiece can include placing a workpiece on a susceptor disposed within a processing chamber. The method can include performing a multi-cycle thermal treatment process comprising at least two thermal cycles. Each thermal cycle of the at least two thermal cycles can include performing a first treatment on the workpiece at a first temperature; heating a device side surface of the workpiece to a second temperature; performing a second treatment on the workpiece at approximately the second temperature; and cooling the workpiece subsequent to performing the second treatment.

In some embodiments, one or more flash lamps can be used to heat the device side surface of the workpiece to the second temperature. More specifically, the one or more flash lamps can heat the device side surface of the workpiece to the second temperature in less than about one second.

In some embodiments, cooling the workpiece includes cooling the workpiece using the susceptor. More specifically, the susceptor can be configured to accommodate a flow of fluid to cool the workpiece. In some embodiments, the fluid includes Freon. It should be appreciated, however, that any suitable fluid (e.g., gas, liquid) can be used to cool the workpiece. As an example, the fluid can be comprised of water. As another example, the fluid can be comprised of ethylene glycol. As yet another example, the fluid can be comprised of ethylene glycol and water.

In some embodiments, performing the first treatment process includes exposing the device side surface of the workpiece to one or more species generated in a remote plasma chamber. Alternatively and/or additionally, performing the first treatment includes exposing the device side surface of the workpiece to one or more gases.

In some embodiments, performing the second treatment process includes exposing the device side surface of the workpiece to one or more gases. Alternatively and/or additionally, performing the second treatment comprises exposing the device side surface of the workpiece to one or more species generated in a remote plasma chamber. In some embodiments, a grid is disposed between the remote plasma chamber and the processing chamber.

In some embodiments, the second treatment comprises an anneal treatment. Alternatively and/or additionally, the second treatment comprises implementing a chemical reaction on the device side surface of the workpiece.

In some embodiments, a method for processing a workpiece includes placing a workpiece on a susceptor disposed within a processing chamber. The method includes performing a multi-cycle thermal treatment process on the workpiece while the workpiece is within the processing chamber (e.g., and without having to remove the workpiece from the processing chamber). The multi-cycle thermal treatment process includes performing a first treatment on the workpiece at a first temperature; heating a device side surface of the workpiece to a second temperature; performing a second treatment on the workpiece at the second temperature; and cooling the workpiece subsequent to performing the second treatment. Subsequent to cooling the workpiece, the multi-cycle thermal treatment process includes performing a third treatment on the workpiece at the first temperature. Subsequent to performing the third treatment, the multi-cycle thermal treatment process includes heating the device side surface of the workpiece to approximately the second temperature. Subsequent to performing the third treatment, the multi-cycle thermal treatment process includes performing a fourth treatment on the workpiece at approximately the second temperature. Subsequent to performing the fourth treatment, the multi-cycle thermal treatment process includes cooling the workpiece. In some embodiments, one or more flash lamps can be used to heat the device side surface of the workpiece to the second temperature in less than one second.

In some embodiments, the third treatment is equivalent to the first treatment. Alternatively and/or additionally, the fourth treatment is equivalent to the second treatment. In some embodiments, both the second treatment and the fourth treatment include an anneal treatment. In some embodiments, both the second treatment and the fourth treatment include implementing a chemical reaction on the device side surface of the workpiece.

The methods according to example aspects of the present disclosure provide numerous technical benefits. For instance, heating the device side surface of the workpiece with one or more flash lamps or other heat sources can reduce the amount of time that is needed to raise the temperature of the device side surface from the first temperature to the second temperature. Additionally, cooling the workpiece with the susceptor can reduce the amount of time that is needed to lower the temperature from the second temperature to the first temperature. In this manner, the amount of time required for each cycle of the multi-cycle thermal treatment process can be reduced. Because multiple thermal cycles can be implemented in the same processing chamber, the time for cycling between processing chambers (e.g., for heating and cooling) can be reduced, leading to faster processing times.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. It should be appreciated that the workpiece can include a device side surface that can include one or more device structures, films, or layers that are annealed during the energy pulse. The workpiece can also include an opposing non-device side surface that can include no device structures. As used herein, use of the term "about" or "approximately" in conjunction with a numerical value is intended to refer to within ten percent (10%) of the stated numerical value.

Referring now to the FIGS., FIG. 1 depicts a workpiece processing apparatus 100 that can be used to perform processes according to example embodiments of the present disclosure. As illustrated, the workpiece processing apparatus 100 defines a processing chamber 110. The processing chamber 110 can include a susceptor 120 operable to hold a workpiece 130 to be processed, such as a semiconductor wafer. In some embodiments, the workpiece 130 can be placed on the susceptor 120 such that a non-device side surface 132 of the workpiece 130 contacts the susceptor 120.

In some embodiments, the workpiece processing apparatus 100 can include one or more flash lamps 140 configured to emit light onto the workpiece 130. More specifically, the one or more flash lamps 140 can emit light onto a device side surface 134 of the workpiece 130. It should be appreciated that the device side surface 134 of the workpiece 130 is opposite to the non-device side surface 132 of the workpiece 130.

The flash lamps 140 can be, for instance, an arc lamp, halogen lamp, or other lamp heat source (e.g., LED lamp heat source). Aspects of the present disclosure are discussed with reference to flash lamps 140 for purposes of illustration and discussion. Other heat sources, such as, but not limited to, a hot plate or susceptor, a hot gas stream, radiant heat sources, such as lasers, heat sources producing particle beams, heat sources producing RF, or heat sources producing microwave, can be used without deviating from the scope of the present disclosure.

In some embodiments, a dielectric window 150 is located above the workpiece 100 and acts as a ceiling of the processing chamber 110. As shown, the one or more lamps 140 can be disposed outside the processing chamber 110. More specifically, the one or more flash lamps 140 can be configured to emit light through the dielectric window 150 and into the processing chamber 110. In this manner, the one or more flash lamps 140 can heat the device side surface 134 of the workpiece 130.

In some embodiments, the workpiece processing apparatus 100 can include a control device 160 that is operatively coupled to the one or more flash lamps 140. In this manner, the control device 160 can be configured to control operation of the one or more flash lamps 140. In some embodiments, the control device 160 can include a processor and associated memory configured to perform a variety of computer-implemented functions. As used herein, the term "processor" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits. Additionally, the memory can include memory element(s) including, but not limited to, computer readable medium (e.g., random access memory (RAM)), computer readable non-volatile medium (e.g., flash memory), and/or other suitable memory elements or combinations thereof.

Additionally, the control device 160 can include a communications interface. In some implementations, the communications interface can include associated electronic circuitry that is used to send and receive data. In this manner, the control device 160 can send one or more command signals to the one or more flash lamps 140 and/or other controllable aspects of the processing apparatus 100 via the communications interface.

Figure 2:
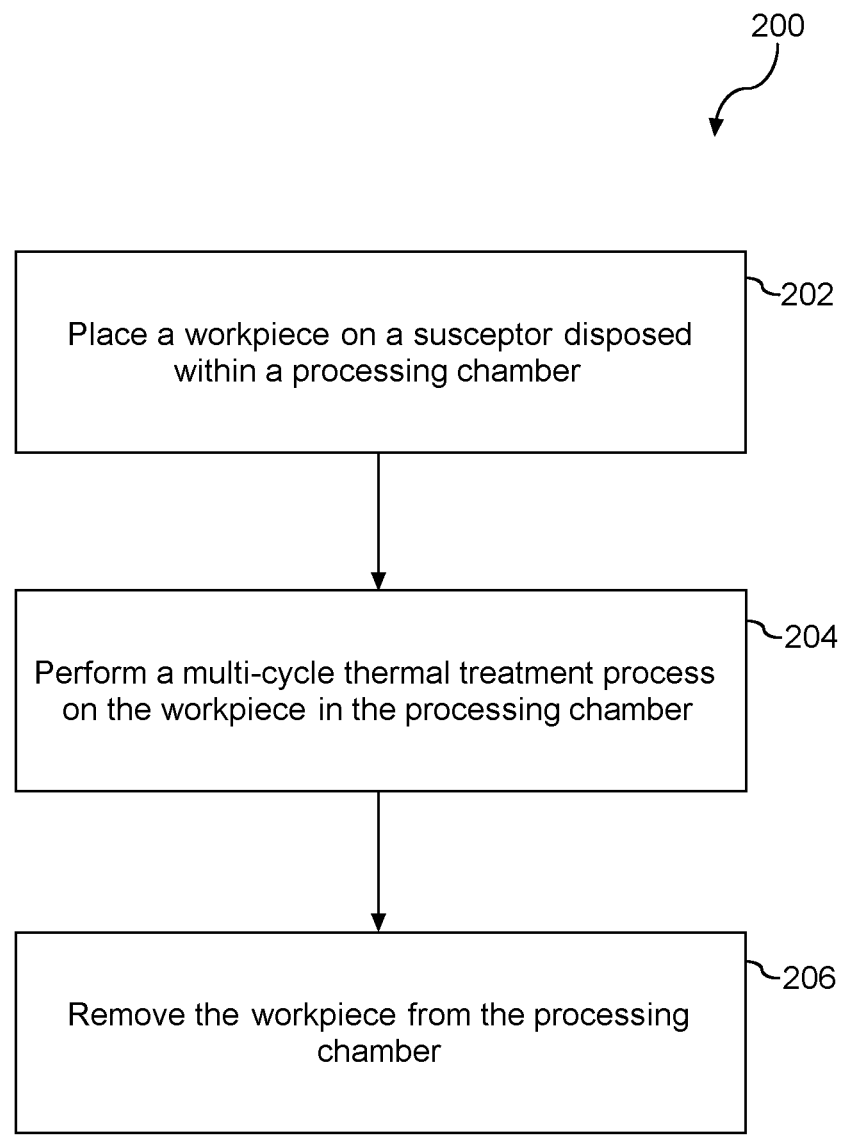
FIG. 2 depicts a flow diagram of a method for processing a workpiece according to example embodiments of the present disclosure.

FIG. 2 depicts a flow diagram of an example method 200 for processing a workpiece according to example aspects of the present disclosure. The method 200 can be implemented using the workpiece processing apparatus 100 discussed above with reference to FIG. 1. However, it should be appreciated that the method 200 can be implemented using other approaches without deviating from the scope of the present disclosure. For instance, the method 200 can be implemented using a plasma processing apparatus 600 depicted in FIG. 6. It should be appreciated that FIG. 2 depicts steps performed in a particular order for purposes of illustration and discussion. However, those of ordinary skill in the art, using the disclosure provided herein, will understand that various steps of the method 200 described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (202), the method 200 can including placing the workpiece on the susceptor disposed within the processing chamber. For instance, the workpiece can be placed on the susceptor such that a non-device side surface of the workpiece contacts the susceptor.

At (204), the method 200 can include performing a multi-cycle thermal treatment process on the workpiece while in the processing chamber. For instance, a multi-cycle thermal treatment process can be performed on the workpiece in the processing chamber. As will be discussed below in more detail, the multi-cycle thermal treatment process can include at least two thermal cycles. The at least two thermal cycles can be performed without having to remove the workpiece from the processing chamber.

Figure 3:
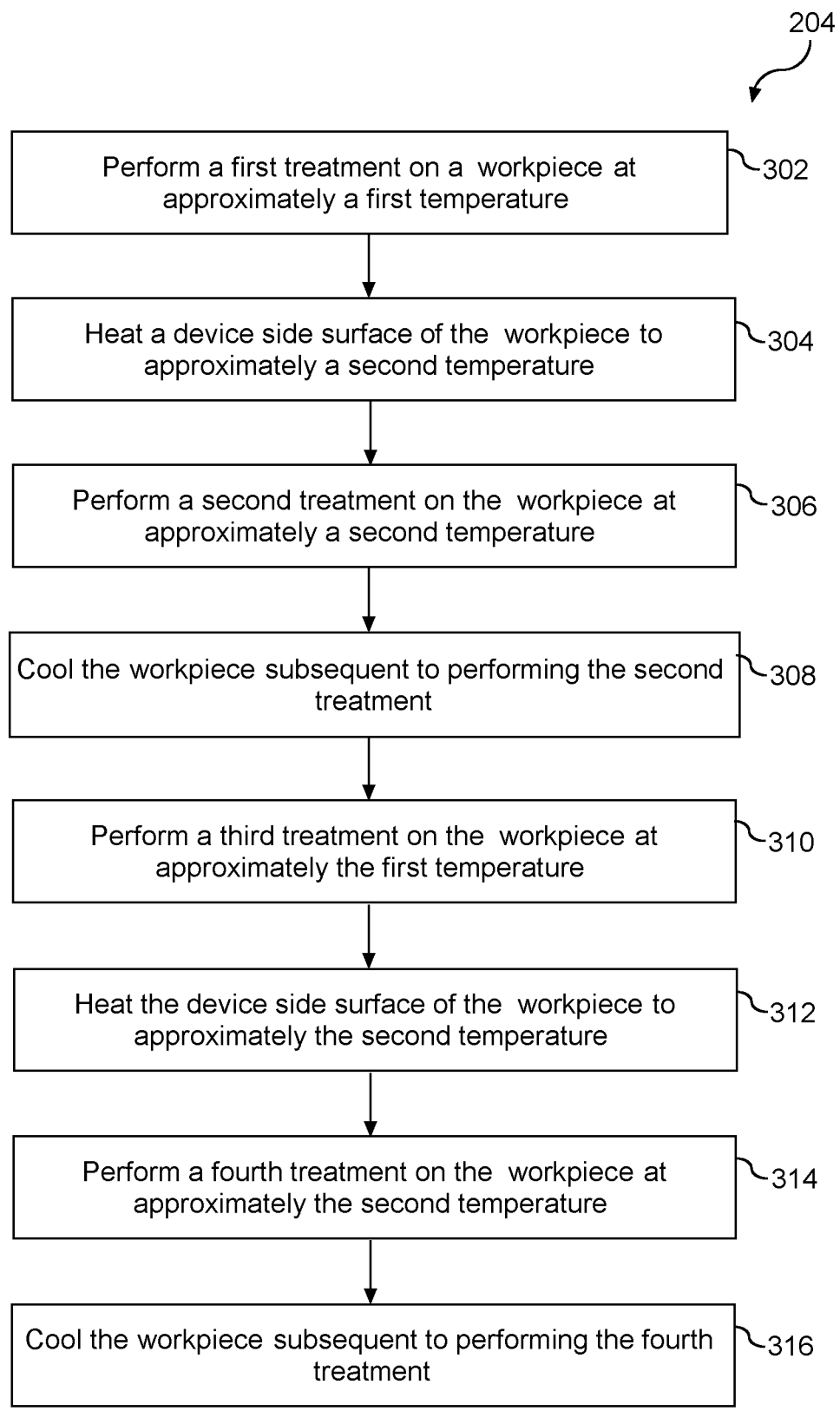
FIG. 3 depicts a flow diagram of an example multi-cycle thermal treatment process according to example embodiments of the present disclosure.

FIG. 3 depicts a flow diagram of an example multi-cycle thermal treatment process according to example embodiments of the present disclosure. FIG. 3 depicts steps performed in a particular order for purposes of illustration and discussion. Those of ordinary skill in the art, using the disclosure provided herein, will understand that various steps of the multi-cycle thermal treatment process described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (302), the multi-cycle thermal treatment process can include performing a first treatment on the workpiece at approximately a first temperature. For example a first treatment can be performed on the workpiece while the workpiece is at the first temperature. The first treatment can be a surface treatment process, such as a surface treatment processes used as part of an atomic layer deposition process and/or an atomic layer etch process. In some embodiments, the first treatment can include exposing the device side surface of the workpiece to one or more gases. In some embodiments, the first treatment can include exposing the device side surface of the workpiece to one or more species (e.g. neutral radicals) generated in a remote plasma chamber of a plasma processing apparatus (e.g., the plasma processing apparatus of FIG. 6).

At (304), the multi-cycle thermal treatment process can include heating the workpiece to approximately a second temperature. The second temperature can be greater than the first temperature. For instance, in some embodiments, the workpiece 130 can be heated to the second temperature via the one or more flash lamps 140 or other heat source. In example embodiments, the control device can control operation of the one or more flash lamps or other heat source such that the one or more flash lamps heat the device side surface of the workpiece to the second temperature in less than one second, such as less than 1 millisecond, such as between 0.5 milliseconds and 10 milliseconds.

Other heating elements can be used to heat the workpiece to the second temperature. For instance, the workpiece can be heated to the second temperature via the susceptor. In example embodiments, the susceptor can include one or more heating elements configured to provide heat to the workpiece. Additionally, the control device can be operatively coupled to one or more heating elements. In this manner, the control device can control operation of the one or more heating elements to heat the workpiece to the second temperature.

At (306), the multi-cycle thermal treatment process can include performing a second treatment on the workpiece at approximately the second temperature. The second treatment can be a surface activation process, such as a surface activation processes used as part of an atomic layer deposition process and/or an atomic layer etch process. In some embodiments, the second treatment can include exposing the device side surface of the workpiece to one or more gases. In some embodiments, the second treatment can include exposing the device side surface of the workpiece to one or more species (e.g. neutral radicals) generated in a remote plasma chamber of a plasma processing apparatus (e.g., the plasma processing apparatus of FIG. 6). In some embodiments, the second treatment can include annealing the workpiece. In some embodiments, the second treatment can include implementing a chemical reaction on the device side surface of the workpiece.

At (308), the multi-cycle thermal treatment process can include cooling the workpiece. For instance, the workpiece bulk can facilitate rapid cooling of the workpiece, because the workpiece bulk is not heated as rapidly as the workpiece surface during heating of the workpiece from the first temperature to the second temperature. As a result, the workpiece bulk facilitates cooling of the workpiece surface after the second treatment. In example embodiments, the susceptor can be configured to cool the workpiece. For instance, in some embodiments, the susceptor can be configured to accommodate a flow of fluid to cool the workpiece.

Figure 4:
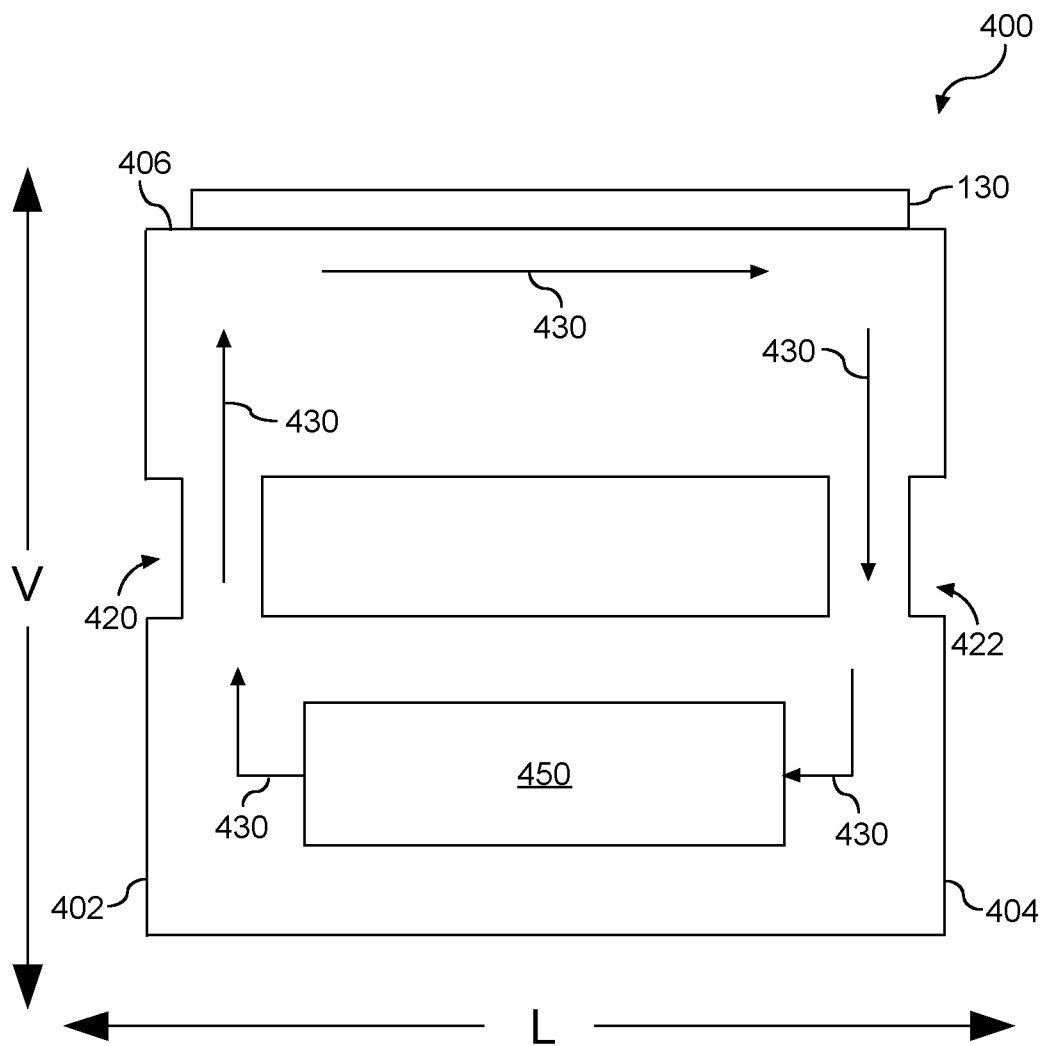
FIG. 4 depicts an example susceptor according to example embodiments of the present disclosure.

FIG. 4 depicts an example susceptor 400 configured to accommodate cooling of a workpiece according to example embodiments of the present disclosure. The susceptor 400 extends between a first side 402 and a second side 404 along a lateral direction L, and between a top portion 406 and a bottom portion along a vertical direction V. In some embodiments, the susceptor 400 defines an inlet 420 and an outlet 422. In this manner, a flow of fluid 430 can enter and exit the interior of the susceptor 400. As shown, the inlet 420 can be defined on the first side 402 of the susceptor 400, and the outlet 422 can be defined on the second side 404 of the susceptor 400. It should be appreciated, however, that the inlet 420 and outlet 422 can be located at any suitable location on the susceptor 400.

In some embodiments, the flow of fluid 430 can flow into and out of a heat exchanger 450. It should also be appreciated that the flow of fluid 430 can be comprised of any suitable liquid or gaseous substance. For example, in some embodiments, the flow of fluid 430 can be comprised of Freon. As another example, the flow of fluid 430 can be comprised of water. As yet another example, the flow of fluid 430 can be comprised of ethylene glycol. As still another example, the flow of fluid 430 can be comprised of ethylene glycol and water.

Referring again to FIG. 3, the multi-cycle thermal treatment process can include, at (310), performing a third treatment on the workpiece at approximately the first temperature. In example embodiments, the third treatment process can be the same (e.g., equivalent) as the first treatment performed at (302).

At (312), the multi-cycle thermal treatment process can include heating the device side surface of the workpiece to approximately the second temperature. In example embodiments, the control device can control operation of the one or more flash lamps or other heat source such that the one or more flash lamps heat the device side surface of the workpiece to the second temperature in less than one second, such as less than 1 millisecond, such as between 0.5 milliseconds and 10 milliseconds.

At (314), the multi-cycle thermal treatment process can include performing a fourth treatment on the workpiece at approximately the second temperature. In example embodiments, the fourth treatment process can be the same (e.g., equivalent) as the second treatment performed at (306). In some embodiments, the second treatment and the fourth treatment can include a surface activation process. For instance, both the second treatment and the fourth treatment can include an anneal treatment. Alternatively and/or additionally, both the second treatment and the fourth treatment can include implementing a chemical reaction on the device side surface of the workpiece.

At (316), the multi-cycle thermal treatment process can include cooling the workpiece. Although the multi-cycle thermal treatment process depicted in FIG. 4 depicts only two cycles, it should be appreciated that the multi-cycle thermal treatment process can include any suitable number of cycles needed to process the workpiece.

Figure 5:
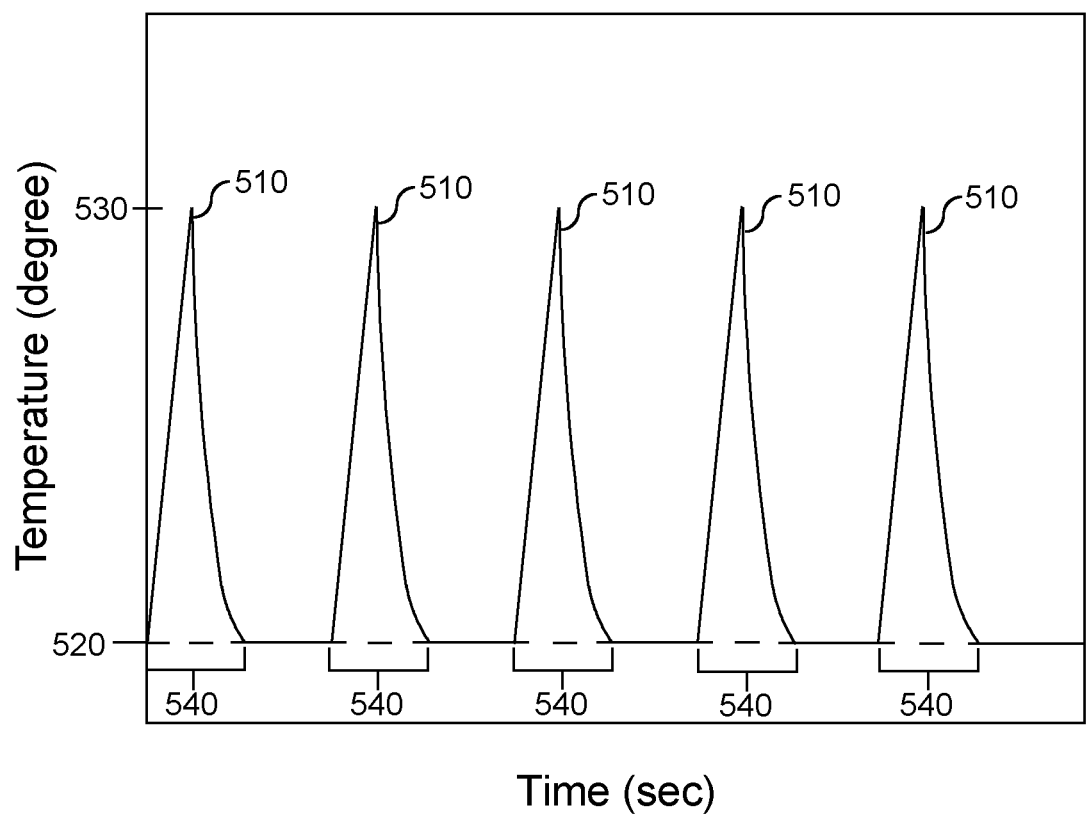
FIG. 5 depicts a graphical representation of a multi-cycle thermal treatment process according to example embodiments of the present disclosure.

Referring now to FIG. 5, a graphical representation of a multi-cycle thermal treatment processes is provided according to example embodiments of the present disclosure. As shown, changes in the temperature of the workpiece can occur during the multi-cycle thermal treatment process. More specifically, FIG. 5 depicts a plurality of cycles 510 indicative of the temperature of the wafer transitioning from a first temperature 520 to a second temperature 530 and then cooling to the first temperature 520. In some embodiments, a difference between about the first temperature 520 and about the second temperature 530 can be greater than 100 degrees Kelvin.

In example embodiments, the heat source(s) can be controlled to raise the temperature of the workpiece from the first temperature 520 to the second temperature 530 in less than about one second, such as in less than about 1 ms, such as between 0.5 ms and 10 ms. The workpiece can be rapidly cooled to approximately the first temperature 520 to complete the cycle 510. In some embodiments, the time to cool from the second temperature 530 to approximately the first temperature 520 can be less than about one second, such as in less than about 1 ms, such as between 0.5 ms and 10 ms. The time between cycles 510 can be greater than a duration 540 of each cycle 510.

Referring again to FIG. 2, the method 200 can, at (206), include removing the workpiece from the processing chamber subsequent to performing the multi-cycle thermal treatment process at (204). In this way, multiple thermal cycles can be implemented without having to remove the workpiece from the processing chamber.

As discussed above, in some embodiments, a thermal cycle can include exposing a surface of the workpiece to species generated using a plasma. For instance, the method can include exposing a surface of the workpiece to species (e.g., neutral radicals) generated in a remote plasma source separated from the processing chamber by a separation grid.

Figure 6:
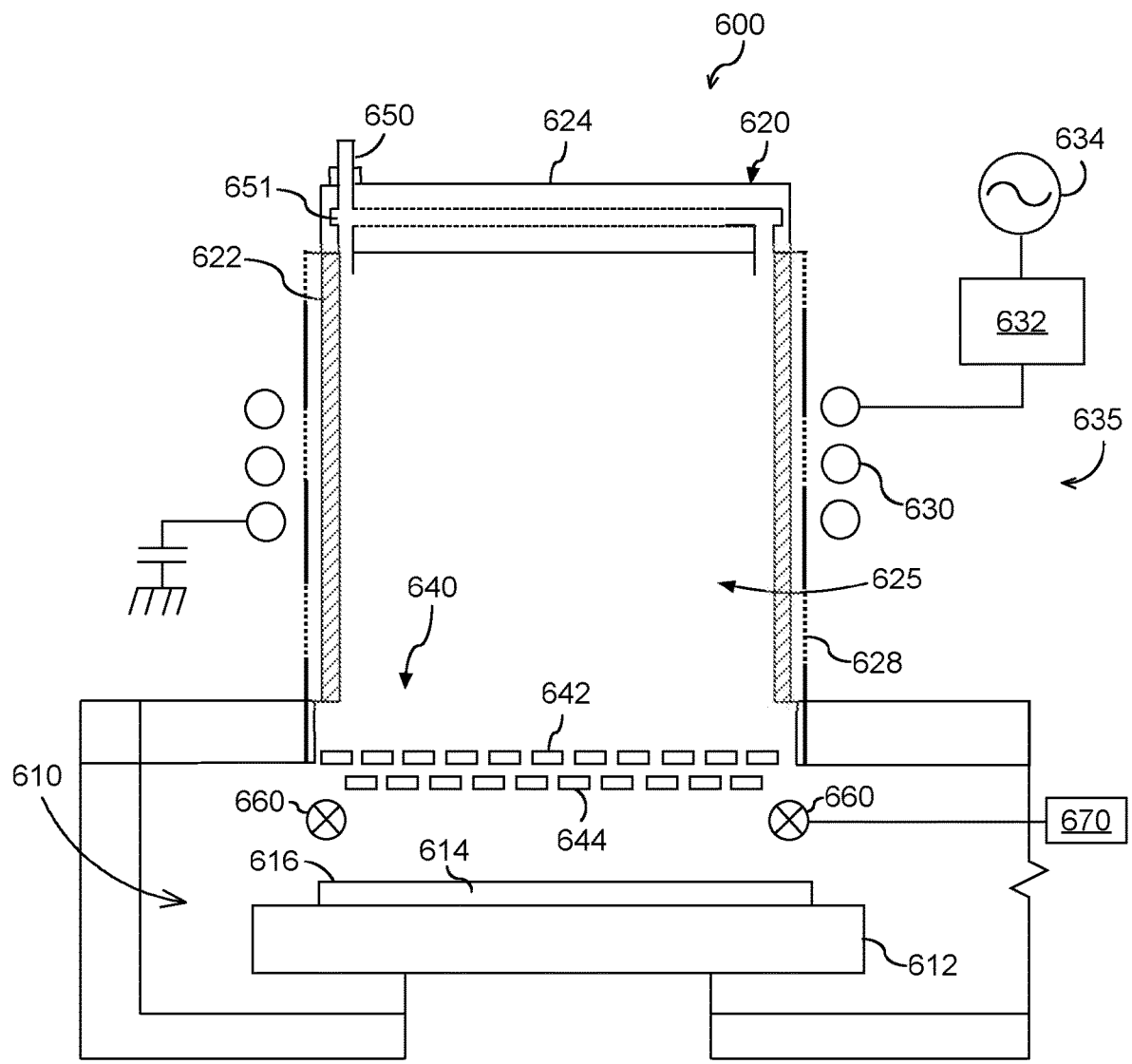
FIG. 6 depicts an example plasma processing apparatus according to example embodiments of the present disclosure.

Referring now to FIG. 6, an example plasma processing apparatus 600 that can be used to expose a surface of the workpiece to species (e.g., neutral radicals) is provided. As illustrated, the plasma processing apparatus 600 includes a processing chamber 610 and a plasma chamber 620 that is separated from the processing chamber 610. The processing chamber 610 includes a susceptor 612 operable to hold a workpiece 614 to be processed, such as a semiconductor wafer. In some embodiments, the susceptor 612 can be configured to accommodate a flow of fluid to cool the workpiece (see e.g., FIG. 4). It should be appreciated that the flow of fluid can be comprised of any suitable fluid (e.g., liquid or gas). For example, the flow of fluid can, in some embodiments, can include Freon. As another example, the flow of fluid can be comprised of water. As yet another example, the flow of fluid can be comprised of ethylene glycol. As still another example, the flow of fluid can be comprised of ethylene glycol and water.

In this example illustration, a plasma is generated in plasma chamber 620 (i.e., plasma generation region) by an inductively coupled plasma source 635 and desired species are channeled from the plasma chamber 620 to the surface of the workpiece 614 through a separation grid assembly 640.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 620 includes a dielectric side wall 622 and a ceiling 624. The dielectric side wall 622, ceiling 624, and separation grid assembly 640 define a plasma chamber interior 625. Dielectric side wall 622 can be formed from a dielectric material, such as quartz and/or alumina. The inductively coupled plasma source 635 can include an induction coil 630 disposed adjacent the dielectric side wall 622 about the plasma chamber 620. The induction coil 630 is coupled to an RF power generator 634 through a suitable matching network 632. Process gases (e.g., an inert gas) can be provided to the chamber interior from a gas supply 650 and annular gas distribution channel 651 or other suitable gas introduction mechanism. When the induction coil 630 is energized with RF power from the RF power generator 634, a plasma can be generated in the plasma chamber 620. In a particular embodiment, the plasma processing apparatus 600 can include an optional grounded Faraday shield 628 to reduce capacitive coupling of the induction coil 630 to the plasma.

As shown in FIG. 6, the separation grid assembly 640 separates the plasma chamber 620 from the processing chamber 610. The separation grid 640 can be used to perform ion filtering from a mixture generated by plasma in the plasma chamber 620 to generate a filtered mixture. The filtered mixture can be exposed to the workpiece 614 in the processing chamber.

In some embodiments, the separation grid 640 can be a multi-plate separation grid. For instance, the separation grid 640 can include a first grid plate 642 and a second grid plate 644 that are spaced apart in parallel relationship to one another. The first grid plate 642 and the second grid plate 644 can be separated by a distance.

The first grid plate 642 can have a first grid pattern having a plurality of holes. The second grid plate 644 can have a second grid pattern having a plurality of holes. The first grid pattern can be the same as or different from the second grid pattern. Charged particles can recombine on the walls in their path through the holes of each grid plate 642, 644 in the separation grid assembly 640. Neutral species (e.g., radicals) can flow relatively freely through the holes in the first grid plate 642 and the second grid plate 644. The size of the holes and thickness of each grid plate 642 and 644 can affect transparency for both charged and neutral particles.

In some embodiments, the first grid plate 642 can be made of metal (e.g., aluminum) or other electrically conductive material and/or the second grid plate 644 can be made from either an electrically conductive material or dielectric material (e.g., quartz, ceramic, etc.). In some embodiments, the first grid plate 642 and/or the second grid plate 644 can be made of other materials, such as silicon or silicon carbide. In the event a grid plate is made of metal or other electrically conductive material, the grid plate can be grounded.

In some embodiments, the plasma processing apparatus 600 can include one or more flash lamps 660 or other heat source disposed within the processing chamber 610. In this manner, the one or more flash lamps 660 can be configured to heat the workpiece 614. More specifically, the one or more flash lamps 660 can emit light onto a device side surface 616 of the workpiece 614. It should be appreciated that the flash lamps 660 can be located elsewhere with respect to the processing chamber 610 without deviating from the scope of the present disclosure.

In some embodiments, the plasma processing apparatus 600 can include a control device 670 that is operatively coupled to the one or more flash lamps 660. In this manner, the control device 670 can be configured to control operation of the one or more flash lamps 660. In some embodiments, the control device 670 can include a processor and associated memory configured to perform a variety of computer-implemented functions.

Additionally, the control device 670 can include a communications interface. In some implementations, the communications interface can include associated electronic circuitry that is used to send and receive data. In this manner, the control device 670 can send one or more command signals to the one or more flash lamps 660 via the communications interface. In some embodiments, operation of the one or more flash lamps 660 can be controlled based, at least in part, on the one or more command signals.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the method comprising:
    placing a workpiece on a susceptor disposed within a processing chamber;
    performing a multi-cycle thermal treatment process on the workpiece while the workpiece is disposed within the processing chamber, the multi-cycle thermal treatment process comprising at least two thermal cycles, each thermal cycle of the at least two thermal cycles comprising:
        performing a first treatment on the workpiece at a first temperature, the first treatment comprising exposing the workpiece to one or more species generated in a remote plasma chamber;
        heating, by one or more flash lamps, a device side surface of the workpiece to a second temperature;
        performing a second treatment on the workpiece at approximately the second temperature, the second treatment comprising an anneal treatment; and
        subsequent to performing the second treatment, providing a flow of fluid through an interior of the susceptor to cool the workpiece,
            wherein heating by one or more flash lamps a device side surface of the workpiece has a duration of less than about one second.

2. The method of claim 1, wherein a layer of material is removed from the workpiece during each thermal cycle of the at least two thermal cycles.

3. The method of claim 1, wherein a layer of material is deposited onto the workpiece during each thermal cycle of the at least two thermal cycles.

4. The method of claim 1, wherein the flow of fluid comprises Freon fluid.

5. The method of claim of claim 1, wherein the flow of fluid comprises water.

6. The method of claim 1, wherein the flow of fluid comprises ethylene glycol.

7. The method of claim 1, wherein performing the first treatment comprises exposing the device side surface of the workpiece to one or more gases.

8. The method of claim 1, wherein performing the second treatment comprises exposing the device side surface of the workpiece to one or more gases.

9. The method of claim 1, wherein performing the second treatment comprises exposing the device side surface of the workpiece to one or more species generated in a remote plasma chamber.

10. The method of claim 9, wherein performing the second treatment further comprises exposing the device side surface of the workpiece to one or more gases.

11. The method of claim 10, wherein a grid is disposed between the remote plasma chamber and the processing chamber.

12. The method of claim 1, wherein the second treatment comprises implementing a chemical reaction on the device side surface of the workpiece.

13. The method of claim 1, further comprising removing the workpiece from the processing chamber subsequent to performing the multi-cycle thermal treatment process.

14. A method for processing a workpiece, the method comprising:
    placing a workpiece on a susceptor disposed within a processing chamber;
    performing a multi-cycle thermal treatment process on the workpiece while the workpiece is within the processing chamber, the multi-cycle thermal treatment process comprising:
        performing a first treatment on the workpiece at a first temperature, the first treatment comprising exposing the workpiece to one or more species generated in a remote plasma chamber;
        heating, by one or more flash lamps, a device side surface of the workpiece to a second temperature;
        performing a second treatment on the workpiece at approximately the second temperature, the second treatment comprising an anneal treatment;
        subsequent to performing the second treatment, providing a flow of fluid through an interior of the susceptor to cool the workpiece;
        subsequent to providing the flow of fluid through the interior of the susceptor to cool the workpiece, performing a third treatment on the workpiece at approximately the first temperature;
        subsequent to performing the third treatment, heating, by the one or more flash lamps, the device side surface of the workpiece to approximately the second temperature;
        subsequent to performing the third treatment, performing a fourth treatment on the workpiece at approximately the second temperature; and
        subsequent to performing the fourth treatment, providing the flow of fluid through the interior of the susceptor to cool the workpiece,
            wherein the one or more flash lamps heat the device side surface of the workpiece to approximately the second temperature in less than about one second.

* * * * *